US005552563A

United States Patent [19]
Conder et al.

[11] Patent Number: 5,552,563
[45] Date of Patent: Sep. 3, 1996

[54] SHIELDED LOW NOISE MULTI-LEAD CONTACT

[75] Inventors: Jeff E. Conder, Vancouver; Meral B. Woodberry, Ridgefield, both of Wash.

[73] Assignees: Sharp Microelectronics Technology, Inc., Camas, Wash.; Sharp Kabushiki, Osaka, Japan

[21] Appl. No.: 407,385

[22] Filed: Mar. 17, 1995

[51] Int. Cl.⁶ .................................................. H05K 9/00
[52] U.S. Cl. ........................................ 174/35 R; 257/781
[58] Field of Search ............................ 174/35 R, 35 GC, 174/52.4; 29/827–838; 257/659, 666, 692–697, 734–737, 781, 784–786; 437/217, 220, 221–222

[56] References Cited

U.S. PATENT DOCUMENTS

| | | | |
|---|---|---|---|
| 4,486,945 | 4/1981 | Aigoo | 29/588 |
| 5,192,995 | 2/1991 | Yamazaki et al. | 257/787 |
| 5,233,220 | 2/1992 | Lamson et al. | 257/666 |
| 5,254,871 | 10/1993 | Benavides et al. | 257/666 |
| 5,399,902 | 3/1995 | Bickford et al. | 257/659 |
| 5,483,024 | 1/1996 | Russell et al. | 174/524 |
| 5,484,959 | 1/1996 | Burns | 174/524 |

OTHER PUBLICATIONS

Precision Contacts IC Test Contacts Catalogue, dated 1992.

*Primary Examiner*—Kristine L. Kincaid
*Assistant Examiner*—Robert J. Decker

*Attorney, Agent, or Firm*—David C. Ripma; Gerald W. Maliszewski

[57] ABSTRACT

A modified lead frame is provided for use with electrical component test handlers. A conventional multiple-parallel-conductor lead frame is modified to include two broad, electrically conductive shields positioned on opposite sides of the lead frame. Each shield covers a major portion of one side of the lead frame. Such lead frames are designed for mounting in a predetermined orientation on a lead frame holder, with one side facing toward, and the other side facing away from, the major mass of the holder. The conductive shield positioned on the side facing away from the holder on the modified lead frame of the present invention is electrically coupled to one or more selected conductors on the lead frame. The one or more selected conductors include the power or ground conductor which supplies power to a test component during tests. The shield which faces toward the holder is electrically isolated from all the conductors on the lead frame by an intermediate insulating layer. The shields are affixed to the lead frame in a manner that does not interfere with the flexibility of the lead frame. Consequently, the lead frame can be mounted on a holder and used in the normal manner during component testing. The modifications to the lead frame substantially reduce the inductance of the conductor carrying the power/ground signal during high frequency testing, thereby reducing noise and improving test results. The modified lead frame is fully compatible with conventional lead frame holders used in the present generation of electronic component test handlers. A method for modifying a conventional lead frame is also disclosed.

18 Claims, 11 Drawing Sheets

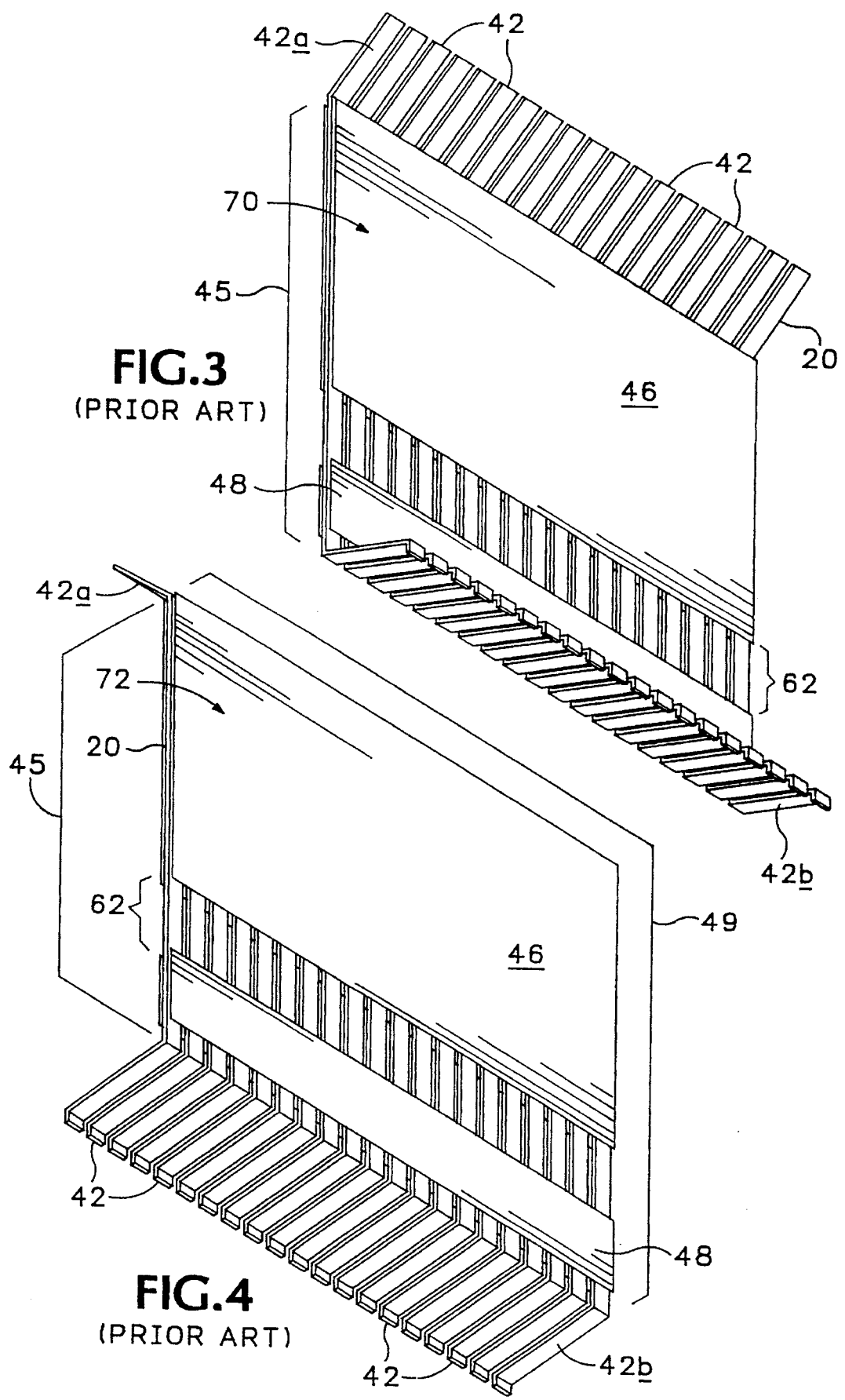

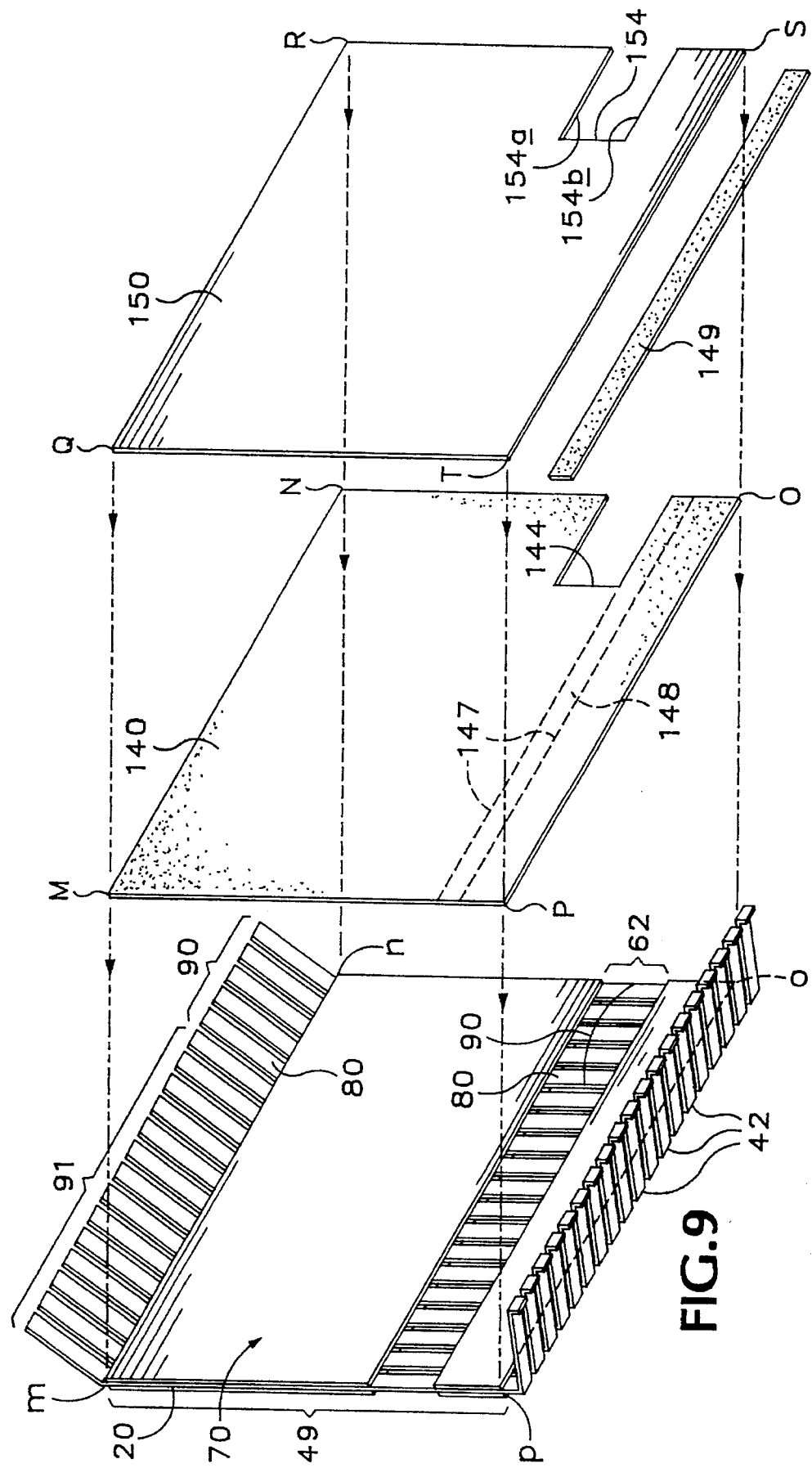

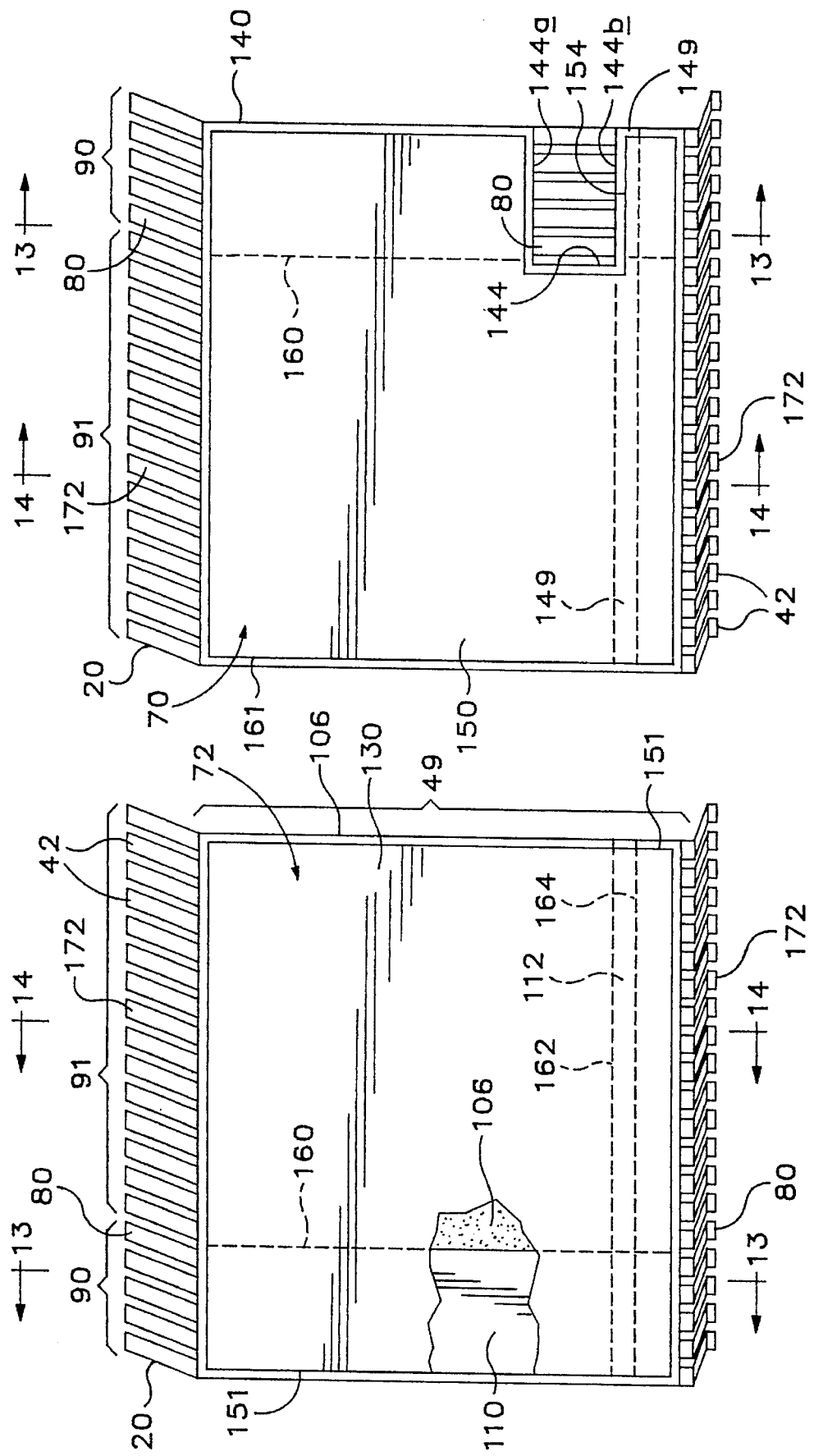

SHIELDED LOW NOISE MULTI-LEAD CONTACT

BACKGROUND AND SUMMARY OF THE INVENTION

The invention relates generally to electrical component test handlers and more particularly to a low noise multi-lead contact made by modifying lead frames of the type which are mounted on holders used in electronic component test handling systems. The invention further relates to a method of modifying prior art lead frames to reduce the inductance of selected leads.

Electrical component test handling systems are designed to subject packaged integrated circuits and similar electronic components to various electrical and environmental tests. Connections are made to selected interconnect pads or pins on the components by means of resilient leads which are bundled together on lead frames containing multiple elongated, uniform, parallel conductors, or leads. Lead frames are generally mounted on holders which orient the lead frames to make convenient contact with the test components, and through which external connections are made to the conductors on the lead frames. During tests the conductors on the lead frames are urged into temporary contact with the interconnect pins on the component package.

Individual thin-strip conductors on a lead frame can exhibit high inductance if high-frequency test signals are used to test components. Such high-frequency test signals, for example, in the 50–100 MHz range, may cause relatively high current gradients in the power supply signal carried to a test component through a lead frame's power or ground conductors. Because of the inductance of the lead frame conductors which supply power to test components, current gradients in the power and ground conductors during high frequency testing produces undesirable voltage fluctuations in the power supply. The consequence is noise and a degradation of the test results.

The inductance of a thin-strip conductor can be reduced by enlarging the cross section of the conductor. In theory, the inductance of the power or ground conductor on a lead frame could be reduced by simply enlarging that conductor. However, lead frames used in component test handlers cannot readily be modified to enlarge a selected conductor without compromising the lead frame's compatibility with related test equipment. Lead frames are mounted on lead frame holders when in use. The lead frame holders are expensive, compared to the cost of lead frames, and the lead frames are made to be replaceable and interchangeable. Most conventional lead frame holders are only compatible with lead frames made up of conductors that are uniform in size, and which have uniform separation between the conductors. The holders can be reconfigured to accept lead frames of different sizes, with different shapes and sizes of uniform conductors. But a lead frame with one or two enlarged conductors, for example, to reduce the inductance of a selected conductor, would not fit a conventional lead frame holder. Consequently, it is not possible to solve the problem presented by excessive inductance in a selected conductor on a lead frame by simply increasing the size or cross section of that selected conductor since the lead frame would then be incompatible with a conventional lead frame holder.

The owners of electronic component test equipment generally have a substantial investment in lead frame holders. The holders are used repeatedly to test production runs of electronic components. If a particular component requires high frequency testing in which the inherent inductance of one or two selected leads on a lead frame will degrade test results, it is not always economically feasible to design, manufacture, and use a custom lead frame having power or ground conductors that are larger than the other leads on the frame. Such an approach is prohibitively costly because it would require both a custom lead frame and a custom holder. Since electronic components are made in the widest possible variety of configurations and pin locations, with ground-and power-supply pins at differing locations on the packages, it is better if lead frames and holders can be reconfigured easily to test a variety of components. It is simply not cost effective to manufacture a large number of custom lead frames and holders to perform tests on quantities of a single component if the lead frames, and particularly the holders, cannot be re-used. Accordingly, there is a need in the industry for a solution to the high frequency inductance problem using lead frames which are compatible with conventional lead frame holders.

It would, therefore, be advantageous to provide an improved low noise multi-lead contact compatible with the present generation of lead frame holders used in component test handlers, wherein the improved multi-lead contact solves the problem of power supply voltage fluctuations caused by the inductance of selected leads supplying power to test component.

It would also be advantageous to provide a modified lead frame having multiple parallel conductors in which selected conductors have reduced inductance and other conductors are shielded from high frequency noise.

It would also be advantageous to provide a methodology for modifying prior art lead frames used in component test handlers to reduce the effective inductance of selected leads on the lead frame while leaving the resultant lead frame usable with existing lead frame holders.

Accordingly, a low noise multi-lead contact is provided, adapted from a lead frame, for mounting on a lead frame holder of the type used in electrical component test handlers. Such handlers are designed to selectively complete multiple simultaneous electrical connections with interconnect points on components to test the components. The lead frame from which the low noise multi-lead contact is adapted includes multiple parallel conductors for carrying signals from test equipment to a component. Each such lead frame has opposed inner and outer sides and is mounted on a holder in a predetermined orientation. The inner side of the lead frame is the side which faces the major mass of the holder when mounted thereon and the outer side is opposite the inner side. The low noise multi-lead contact adapted from the lead frame comprises, on the outer side of the lead frame, a first shield formed of an expanse of conductive material overlying a portion of the lead frame. The first shield is electrically coupled to one or more selected conductors on the lead frame, such Selected conductors being referred to as the shield-coupled conductors. The shield-coupled conductors have reduced inductance during selected component tests. The other conductors on the lead frame, referred to herein as shield-isolated conductors, are electrically isolated from the first shield overlying the outer side of the lead frame. A second shield formed of an expanse of conductive material is provided on the inner side of the lead frame. The second shield overlies a portion of the lead frame and is not coupled to any of the conductors. That is, the second shield is electrically isolated from all conductors on the lead frame.

In its preferred form the first and second shields, attached respectively to the outer and inner sides of the lead frame, are each affixed to the lead frame by a narrow band of attachment which extends laterally across the lead frame generally perpendicular to the parallel conductors. The shields are unattached to the lead frame except along the narrow band of attachment. In that way, the lead frame, when mounted on a holder, is flexible and resilient and can be bent when force is exerted perpendicularly against the lead frame to urge the conductors into contact with interconnect points on a component.

More particularly, the first shield, on the outer side of the lead frame, is large enough to overlie both the shield-coupled conductors and the shield-isolated conductors on the lead frame. In order to electrically insulate the shield-isolated conductors from the first shield, a first insulating layer is provided, extending between the first shield and the shield-isolated conductors. A second insulating layer, which extends over the inner side of the lead frame, extends between the conductors and the second shield, electrically insulating the second shield from all the conductors on the lead frame. The first and second insulating layers are preferably formed of an insulating sheet material having a thickness generally in the range of 1-mil to 8-mils. The insulating layers are preferably attached to the lead frame by adhesive.

An elongated electrical connection is established between the shield-coupled conductors on the lead frame and the first shield, the connection extending over a major portion of the length of the shield-coupled conductors. The elongated electrical connection is in the form of a conductive spacer, which is a thin sheet of conductive material or foil, preferably having a thickness which is generally equal to the thickness of the first insulating layer. The spacer is positioned between the shield coupled conductors and the first shield. The spacer provides an electrical path between the one or more shield-coupled conductors and the first shield on the outer side of the lead frame.

Electrical connections are made to individual conductors on a lead frame via contact points extending through the lead frame holder, the contact points making physical contact with selected conductors on the inner side of the lead frame. In order to allow such connections to be made to one or more of the shield-coupled conductors on the lead frame, a connection path is provided through the second shield and second insulating layer on the inner side of the lead frame. When the lead frame is mounted on a holder, suitable contact points are selectively extended from the holder through the connection path to contact selected shield-coupled conductors on the lead frame.

The invention also includes a method of modifying a lead frame of the type which is mounted on a holder used in component test handlers, such lead frames being designed to selectively complete multiple simultaneous electrical connections with interconnect points on test components. Such lead frames have multiple parallel conductors partially covered by adherent insulating material which extends laterally between adjacent conductors to secure the conductors to one another. The lead frames are mounted on the holders in a predetermined orientation and have inner and outer sides determined by the mounting orientation. The outer side faces away from the major mass of the holder, and the inner side faces toward the major mass of the holder, when the lead frame is mounted on a holder. The method of modifying the lead frame comprises the following steps: a) on the outer side of the lead frame, remove an area of adherent insulation to expose the outer side of one or more selected conductors; b) on the outer side of the lead frame, outside the area where the adherent insulation is removed in step a), position insulating sheet material over a major portion of the lead frame to provide a first insulating layer overlying the lead frame; c) on the outer side of the lead frame, position a first shield, formed of an expanse of conductive material, over the first insulating layer provided in step b), including over the portions of the selected conductors exposed in step a), and establish an electrical connection between the first shield and such selected conductors, whereby the first shield is electrically coupled to the selected conductors exposed in step a); d) on the inner side of the lead frame, position insulating sheet material over a major portion of the lead frame to provide a second insulating layer overlying the lead frame, the second insulating layer including a opening therethrough adjacent the selected conductors, whereby selected electrical connections can be established through the opening between a holder and the selected conductors; and e) on the inner side of the lead frame, position a second shield, formed of an expanse of conductive material, over the second insulating layer, except over the opening, such that the second shield is electrically isolated from the lead frame by the second insulating layer.

In its preferred form, the method of modifying a lead frame in accordance with the present invention includes the additional step, on the outer side of the lead frame, of securing the first shield to the first insulating layer by means of a narrow band of attachment extending laterally across the lead frame, generally perpendicular to the parallel conductors. Also, on the inner side of the lead frame, the second shield is secured to the second insulating layer by means of a narrow band of attachment extending laterally across the lead frame, generally perpendicular to the parallel conductors. As such, the two aforementioned securing steps leave the first and second shields unattached to the respective first and second insulating layers except along such narrow bands of attachment. That allows the lead frame to remain flexible, despite the attachment of the conductive shields.

An additional step in the preferred method is to install a conductive element between the first outer shield and the selected conductors to ensure that an electrical connection is established between the first shield and the selected conductors. The element installed is preferably a conductive spacer having generally the same thickness as the first insulating layer. It is installed on the outer side of the lead frame overlying the portions of the selected conductors exposed in step a). The spacer extends between and electrically connects the selected conductors and the first shield. The selected conductors on the lead frame include at least one of the conductors which supplies power to the test component. In other words, the selected conductors include either the power or the ground lead carrying power to the component. The power or ground lead is thus electrically coupled to the first (outer) shield, thereby greatly increasing the cross section of the power or ground lead, reducing its inductance.

BRIEF DESCRIPTION OF THE DRAWING

FIG. 3 is a partial perspective view of a prior art lead frame of the type used with the present invention, as viewed looking generally toward the inner side of the lead frame (prior art).

FIG. 4 is a partial perspective view of the prior art lead frame of FIG. 3 as viewed looking generally toward the outer side of the lead frame (prior art).

FIG. 9 is a partial perspective view of the inner side of the lead frame illustrating the step of positioning an insulating layer on the inner side of the lead frame and the step of positioning a conductive shield over the insulating layer.

FIG. 11 is a partial plan view, partially cut away, of the outer side of the modified lead frame of the present invention.

FIG. 12 is a partial plan view of the inner side of the modified lead frame of the present invention.

DETAILED DESCRIPTION OF THE PREFERRED EMBODIMENT

Figure 1:
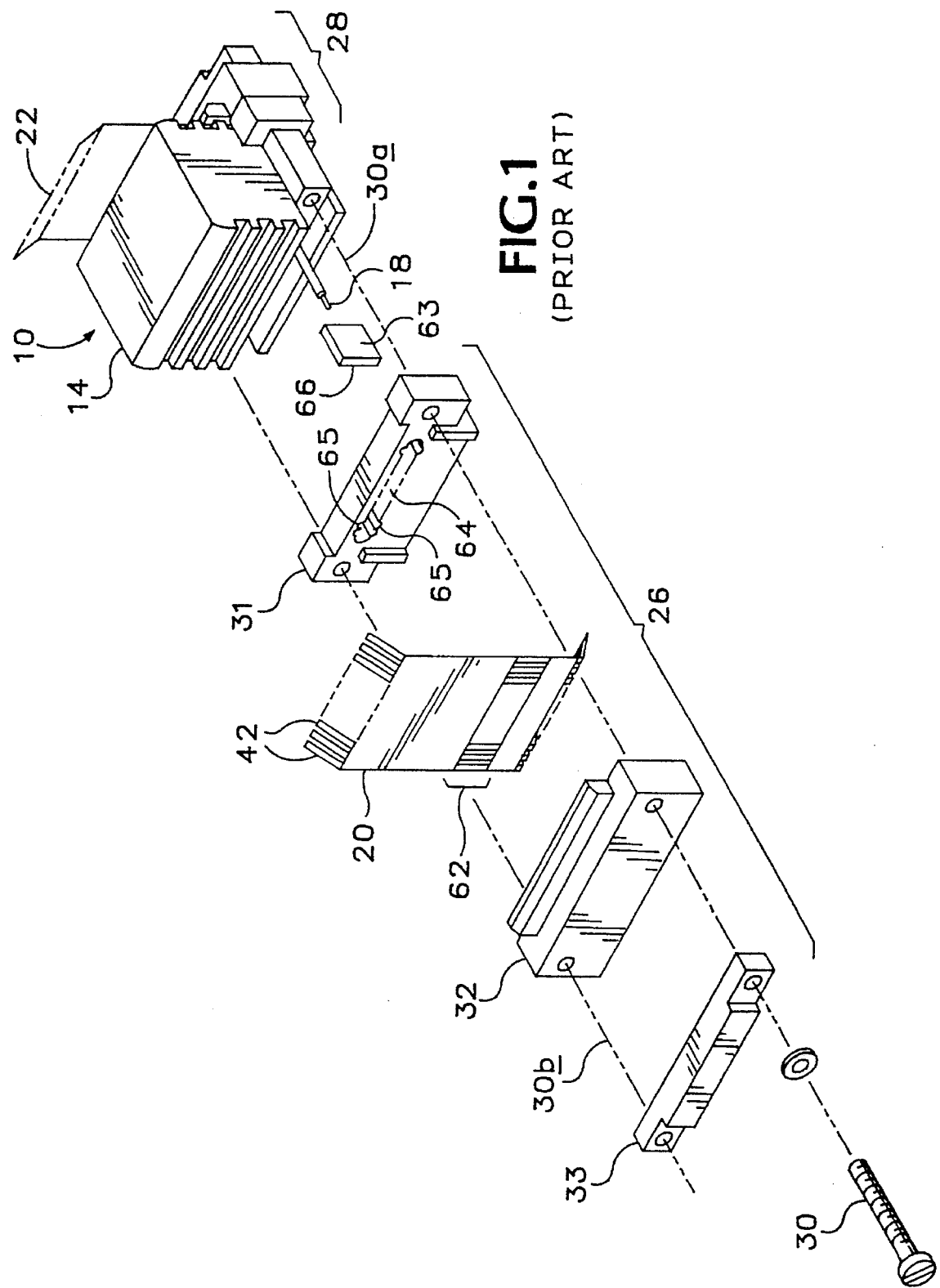
FIG. 1 is a partially exploded view of a lead frame holder of the type used in electrical component test handlers, including one lead frame and holder clamp exploded from the holder and one lead frame and holder clamp assembled and mounted on the holder (prior art).
Figure 2:
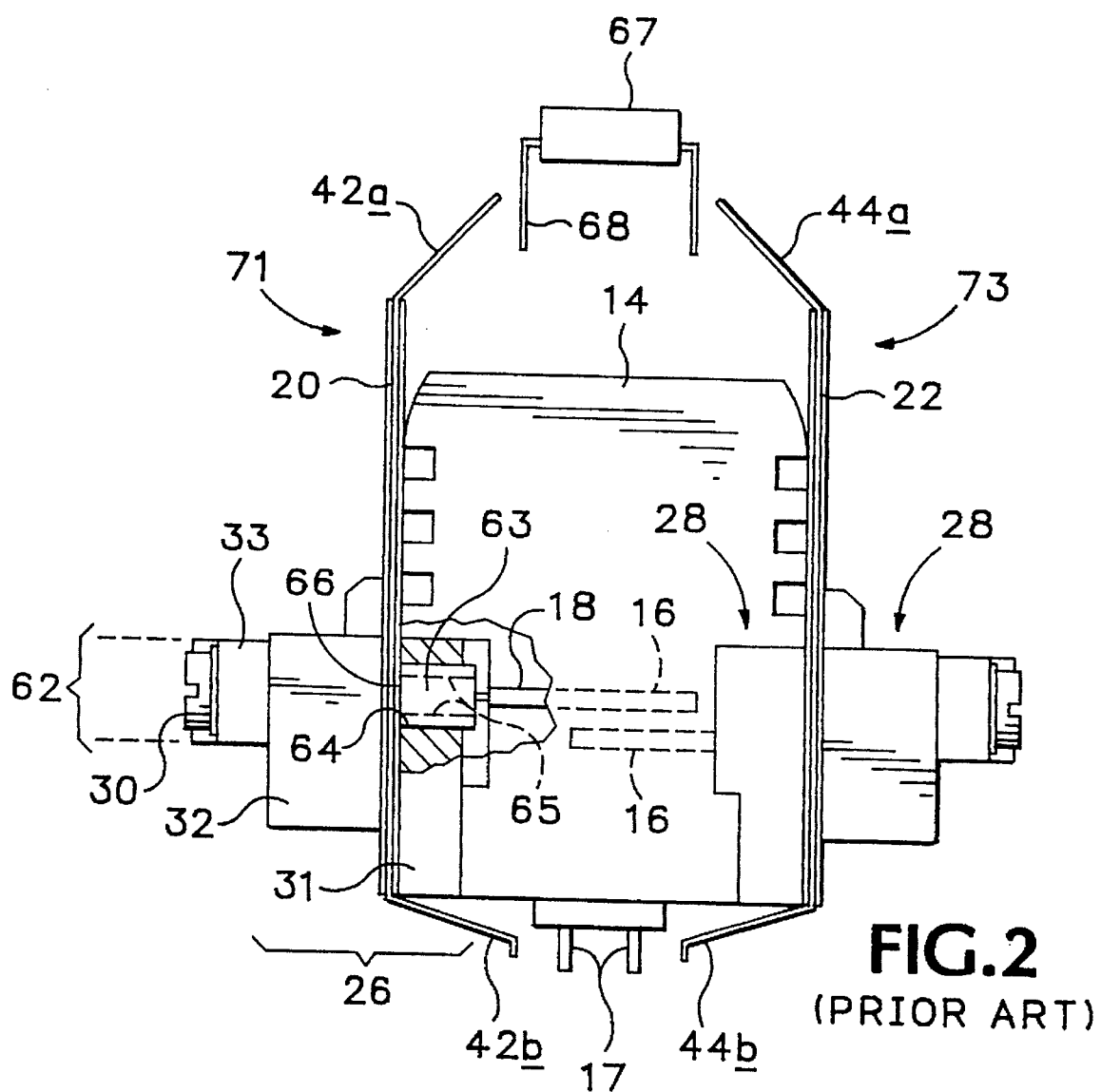
FIG. 2 is a side elevation, on an enlarged scale and partially cut away, showing the holder of FIG. 1 with a pair of lead frames mounted on the holder, and also showing the general location of a sample component while being tested (prior art).

FIGS. 1 and 2 illustrate selected parts of a conventional lead frame holder 10 used in electrical component test handlers. Holder 10, which is partially exploded in FIG. 1 and assembled in FIG. 2, includes a metal grounding block 14 to which various other parts are attached. Block 14, which constitutes the major mass of holder 10 and is the base onto which other elements of the holder are mounted, is preferably made of aluminum or another suitable conductive metal. The interior of block includes passageways, some of which are depicted at 16 in FIG. 2, for receiving internal interconnect pins 18. Other interconnect pins 17 protrude from the bottom of block 14 and are used to complete other external connections. The interconnect pins are selectively installed in the holder to provide internal and external electrical pathways between test components and various test signals used in the testing of such components. Selected pins are installed at selected locations in block 14 to make contact with individual conductors on external lead frames, 20, 22 which are clamped to the sides of holder 10. The purpose and function of pins 17, 18 is well known to those skilled in the art of component test handling systems and the pins form no part of the present invention.

A pair of lead frames 20, 22 are mounted on opposite sides of holder 10 by means of clamp assemblies 26, 28, respectively, which grip and hold each lead frame in a functional position against grounding block 14. The lead frames 20, 22 are parallel connector devices used to complete multiple simultaneous electrical connections with a packaged electrical component positioned generally above block 14, as viewed in FIG. 2. A detailed description of a typical lead frame is provided below, with reference to FIGS. 3 and 4. Clamp assembly 26, which mounts lead frame 20 on holder 10, is shown exploded in FIG. 1. The various parts of clamp assembly 26 include an inner insulating piece 31, which rests against grounding block 14, and an outer insulating piece 32. Pieces 31, 32 are squeezed together, with the lead frame 20 in between, to hold the lead frame in a functioning position relative to holder 10. Clamping pressure is exerted on pieces 31, 32 by an outer rail 33 and a pair of screws which are threaded into block 14. One of the screws 30, which threads along axis 30a, is shown in FIG. 1 and a second screw (not shown) threads along axis 30b. Clamp pieces 31 and 32 are made of plastic or another non-electrically-conductive material. On the opposite side of block 14 lead frame 22, which is identical to clamp assembly 26, is similarly secured to holder 10 by clamp assembly 28.

FIG. 2 is a side enlarged view, partially cut away, of holder 10 showing lead frames 20, 22 mounted on grounding block 14 with clamp 26 fully assembled.

FIGS. 3 and 4 show two sides of a typical prior art 20-conductor lead frame. The lead frame is representative of the type of lead frame 20, 22 mounted on holder 10 in FIGS. 1 and 2. Throughout the following description the lead frame will be identified by reference number 20. The low noise multi-lead contact of the present invention is a modification of a prior art lead frame like lead frame 20. The modification is accomplished by following the steps in the method of the invention, described below.

Lead frame 20 is made up of a plurality of elongated parallel conductor 42 spaced apart from one another and held together by adherent insulation, shown at 46, 48, which surrounds and envelopes each conductor and extends laterally between adjacent conductors. Conductors 42 are elongated, flattened stripes of electrically conductive metal such as beryllium-copper (BeCu). Lead frames are available in a variety of sizes and styles and the present invention can be used with lead frames of various lengths, widths, and spacings between conductors. The conductors 42 on any given model or style of lead frame are uniform in size, spacing, and cross section. As is well known to those skilled in the art, some models of lead frames have uniform parallel conductors which are larger, or more widely spaced apart from one another, or both, as compared with the lead frame depicted in FIGS. 3 and 4. The number, spacing, size, and shape of the conductors on a particular lead frame may vary from those on a different lead frame, but it is a general feature of all such lead frames that the conductors on a lead frame are uniform and parallel. Lead frame 20 used in the description of the illustrative embodiment of the present invention described herein is a Model 3050-50- 20-G32 20-pin lead frame manufactured by Precision Contacts, Inc., 515 Golden Foothill Parkway, El Dorado Hills, Calif. 95762.

It is suitable for mounting on a Symtek Model 3050 holder, which is schematically depicted as holder 10 in FIGS. 1 and 2.

Each conductor 42 on lead frame 20 has a straight central leg portion 45 extending between angled contact fingers 42a, 42b at the opposite ends of the central leg. Contact fingers 42a, 42b extend at an obtuse angle from central leg 45 and are free of adherent insulation. Lead frames are also available with a single contact finger extending from one end of the conductor, instead of the configuration of lead frame 20 wherein contact fingers extend from both ends of each conductor. Lead frame holders, such as holder 10 in FIGS. 1 and 2, also come in a variety of sizes and styles. A holder is generally compatible with a number of different styles of lead frames and can be configured to accommodate lead frames with conductors of different sizes and spacings, the chief limitation being that a lead frame cannot be wider than functional width of clamps 26, 28 (see FIG. 1). Holders are available in different lengths to accommodate wider lead frames containing larger numbers of conductors or lead frames which have conductors of greater width.

As will become apparent in the description below, the present invention modifies the central region 49 of the lead frame, which is the flat central area where adherent insulation 46, 48 extends around and between the conductors. Central area 49 can alternatively be described as the part of the lead frame defined by the flat central legs 45 of conductors 42, not including the angled fingers 42a, 42b. The number (i.e., one or two), shape, or size of the contact fingers on the ends of the lead frame conductors is not important to the present invention.

Figure 13:
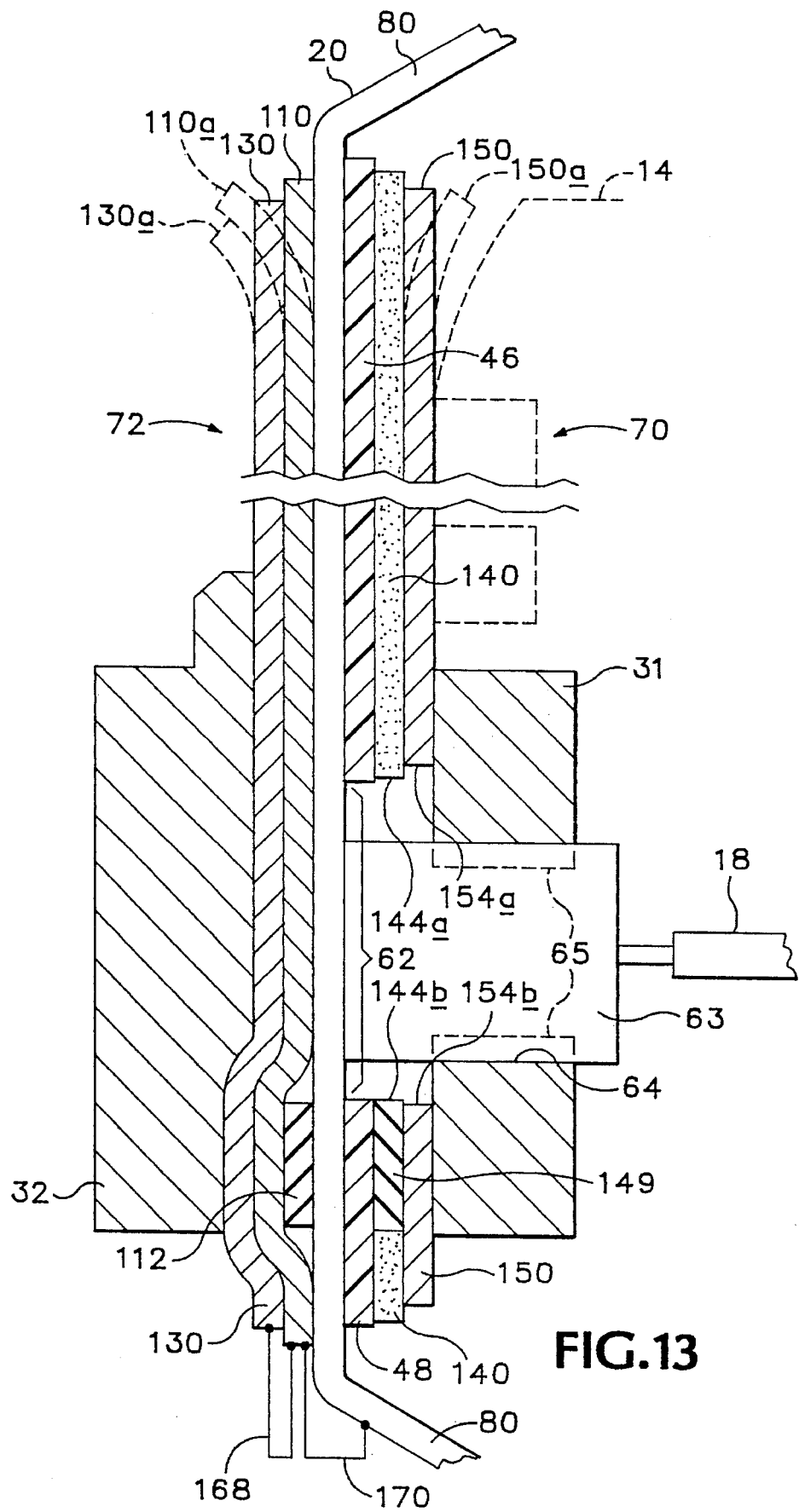
FIG. 13 is a partial, schematic, enlarged, cross-sectional view, taken along line 13—13 of FIGS. 11 and 12, illustrating the various layers in the modified low noise multi-lead contact of the present invention.

The adherent insulation which surrounds and extends between the conductors 42 on lead frame 20 is shown as two broad bands 46, 48 in FIGS. 3 and 4. Insulation 46, 48 is preferably an adherent thermoplastic insulating material such as kapton which covers a major portion of the central region 49 of the conductors on lead frame 20. The insulation bands 46, 48 extend laterally across the lead frame, perpendicular to conductors 42, and are separated from one another by an intermediate contact region 62 left free of insulation. In the contact region 62, each conductor 42 is bare of insulation on all surfaces in order to allow selected electrical connections to be made to individual conductors through holder 10 (FIG. 1). Contact region 62 is located where the lead frame 20 is clamped to holder 10, between clamp pieces 31, 32. Referring back to FIGS. 1 and 2, contact region 62 is shown on lead frame 20. When the lead frame is clamped onto holder 10, contact region 62 is in registration with an elongated opening 64 formed in member 31. Opening 64 includes serration's 65 on the upper and lower surfaces of the opening to receive and hold small rectangular contactor blocks 63 which fit vertically (as viewed in the figures) at predetermined locations within opening 64. When the clamp assembly 26 is fully assembled, a contactor block 63 will fit within opening 64 between serrations 65 (see FIG. 2) in an upright orientation. The narrow upright ends 66 of contactor block 63, which faces outwardly away from holder 10, touches and makes contact with a selected conductor 42 on lead frame 20 once clamp assembly 26 is fully assembled. An internal pin 18 within holder 10 contacts the elongated narrow edge of contactor block 63 opposite to side 66 when clamp 26 is fully assembled. Accordingly, an electrical connection is established between pin 18 and a selected conductor 42 on lead frame 20 via contactor block 63. The contactor blocks are selectively installed in clamp member opening 64 only where such an electrical connection is desired. The use and function of such contact blocks 63 for this purpose is conventional and well known to those skilled in the art. A greatly enlarged schematic view of lead frame 20, contact region 62, contact block 63, opening 64, clamp piece 31, and a partial view of the serrations 65, is shown in FIG. 13 below.

Contact block 63 as used in conventional lead frame holders 10 are of at least 2 different types. When contact block 63 makes contact with the conductor on a lead frame carrying power to the power pin of the component being tested, contact block 63 is customarily a capacitor block equipped with a suitable internal capacitor. When contact block 63 carries the ground connection to a conductor on the lead frame the contact block is a shorting block made of a solid piece of conductive metal. The use and construction of contact block 63 is well known to those skilled in the art of component test handlers and forms no part of the present invention.

Figure 5:
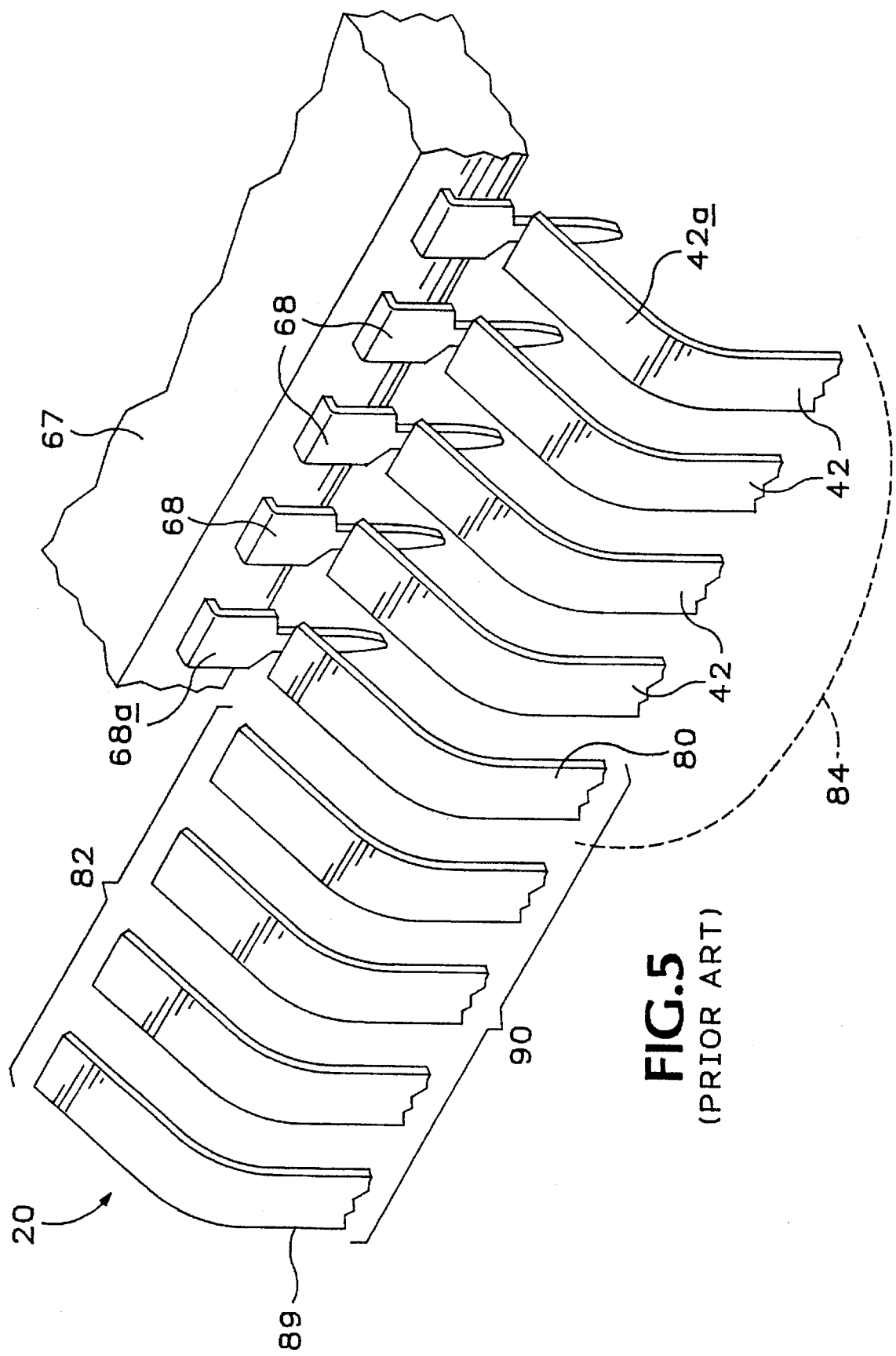
FIG. 5 is a partial perspective view, greatly enlarged, showing the engagement of certain conductors on a lead frame with interconnect points or pins on a component package containing the component being tested (prior art).

The function of lead frame 20 is to make multiple simultaneous connections with interconnect pins on electrical components being tested. FIGS. 2 and 5 illustrate how such connections are made. An end view of a sample electrical component is shown at 67 in FIG. 2, and in a partial prospective view, showing interconnect pins 68 on one side the of component, in FIG. 5. The test component 67 is positioned above lead frame holder 10, between contact fingers 42a (of lead frame 20) and 44a (of lead frame 22), which extend toward one another on the upper ends of lead frames 20, 22, respectively. A suitable carrying frame (not shown) holds and positions component 67 in the location shown in FIGS. 2 and 5. Such component carrying frames are part of a conventional electrical component test handling system. The carrying frames are conventional and form no part of the present invention. Once test component 67 is correctly positioned between opposed lead frames 20, 22 mounted on a holder 10, inward pressure is exerted against the lead frames in the direction of arrows 71, 73 (see FIG. 2) by suitable arms, rails, or the like (not shown) which press inwardly against the upper parts of the lead frames (as viewed in FIG. 2). The lead frames 20, 22 bend inwardly in the direction of arrows 71, 73 until the ends of contact fingers 42a, 44a, respectively make contact with the pins extending from the sides of the package on device 67. Signals supplied to component 67 pass through the base of holder 10, via internal pins 17 and 18 or through the lower contact fingers 42b, 44b on lead frames 20, 22.

FIG. 5 illustrates several of the conductors 42 on lead frame 20 when they are urged into contact with pins 68 on component 67. In the illustrated example, lead frame 20 has 20 parallel conductors 42 and device 67 has a package with 32-pins, 16-pins on each side of the device. Consequently, the lead frame has more conductors than there are pins on the component, so several lead frame conductors 82 overlap the component and are unused. Lead frames and lead frame holders are typically made to accommodate components of different lengths and it is not uncommon for some conductors on a lead frame to be redundant and unused, as are conductors 82 in the example shown.

Figure 6:
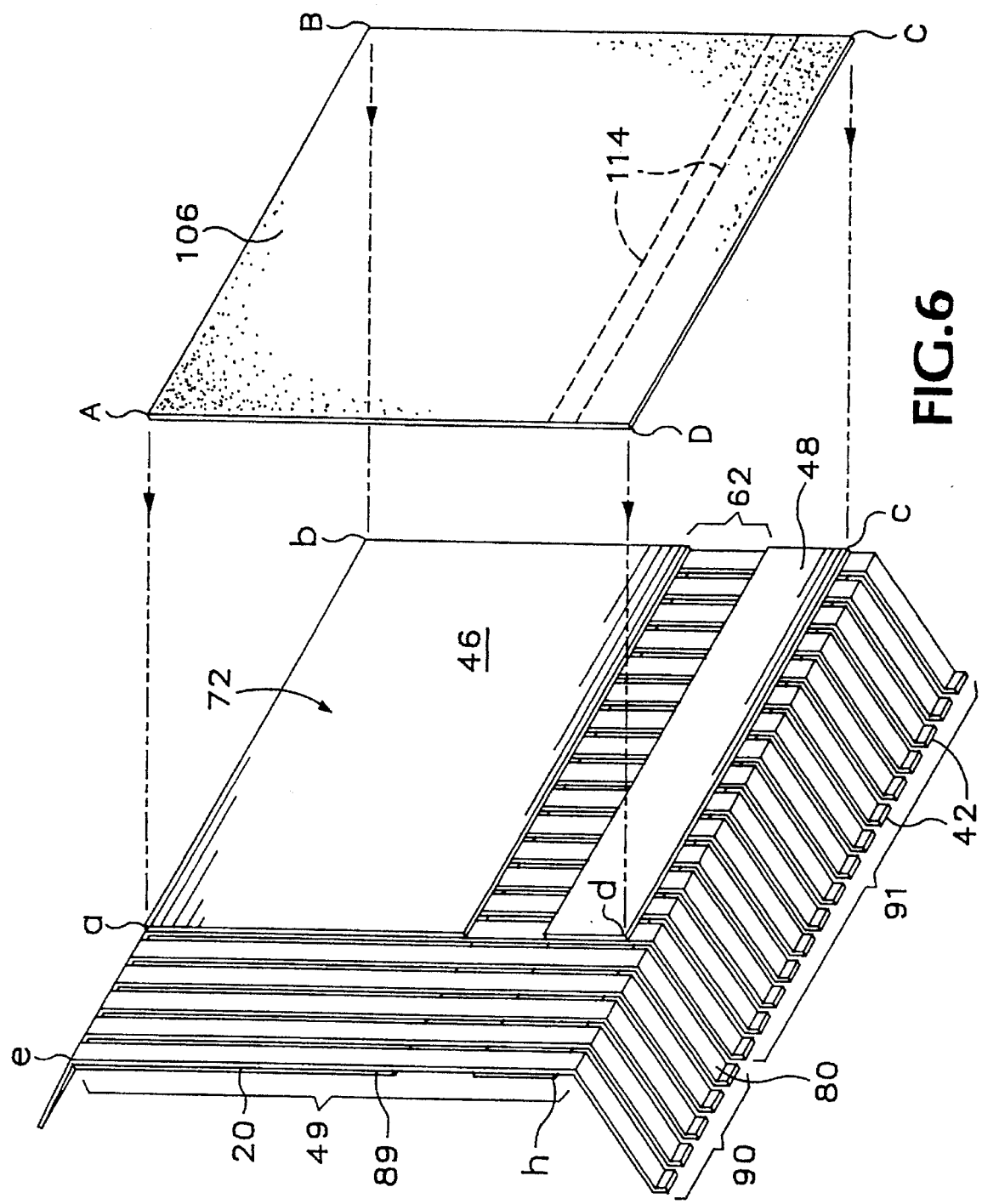
FIG. 6 is a partial perspective view of the outer side of the lead frame of FIG. 4 showing selected steps in the method of modifying the lead frame, including a step wherein adherent insulation has been removed from selected conductors on the lead frame and an insulating layer is positioned over portions of the lead frame.

The prior art lead frame 20 shown in FIGS. 3 and 4 is modified by the present invention to improve its high-frequency performance, to reduce the inductance of the power and ground conductors on the lead frame during high frequency (e.g., 50 MHz+) signal tests, and to improve the shielding of the conductors against electromagnetic noise. FIGS. 6–10 illustrate steps in the method of the present invention by which lead frame 20 is modified. Referring first to FIG. 6, which is a partial perspective view of the outer side 72 of lead frame 20, the first step in the method is to remove an area of adherent insulation from the lead frame to expose the outer side of one or more selected conductors 90. The conductors selected for insulation removal are determined by the location of the conductor which makes contact with the ground or power pin on the component being tested. In the illustrated example, it is assumed that the first four conductors, counting from the left edge 89 of the lead frame, as viewed in FIG. 6, are unused in component testing because they extend beyond the length of the component, in the manner illustrated in FIG. 5. Conductor 80, the fifth conductor from the left edge 89, is the conductor which makes contact with the first pin 68a on one side of the device 67 (see FIG. 5). Pin 68a is the customary location of either the power pin (on one side of a device) or the ground pin (on the other side of a device). Conductor 80 is referred to below as the power/ground conductor on lead frame 20.

The first step in the method is to remove the adherent insulation from power/ground conductor 80 and from the adjacent conductors 82 extending to the edge 89 of the lead frame. The exact number of conductors stripped of adherent insulation on the outer side 72 of the lead frame 20 in this first step depends on the overall length of lead frame 20 relative to the length of the component being tested. In the example of FIG. 5, lead frame 20 is longer than component 67 and has several unused "extra" conductors 82 which do not engage pins 68 on the side of component 67. Therefore, in the example of FIG. 5, the first step in the method is to strip the adherent insulation from power/ground conductor 80 and from adjacent "extra" conductors 82. Thus, in the example of FIG. 5 and figures discussed below, the total number of conductors stripped of adherent insulation on outer side 72 is 5 conductors, which are referred to hereinafter as selected conductors 90. Should lead frame 20 have a greater or lesser number of conductors than in the embodiment shown in FIGS. 3 and 4, or if component 67 is shifted relative to lead frame 20 such that a greater or lesser number of conductors are adjacent to power/ground conductor 80, the total number of conductors stripped in the first step will be different. What is important in the first step is that power/ground conductor 80 and the adjacent, unused, "extra" conductors 82, extending to the nearest edge 89 of the lead frame, be stripped of adherent insulation on the outer side 72 of the lead frame.

Figure 7:
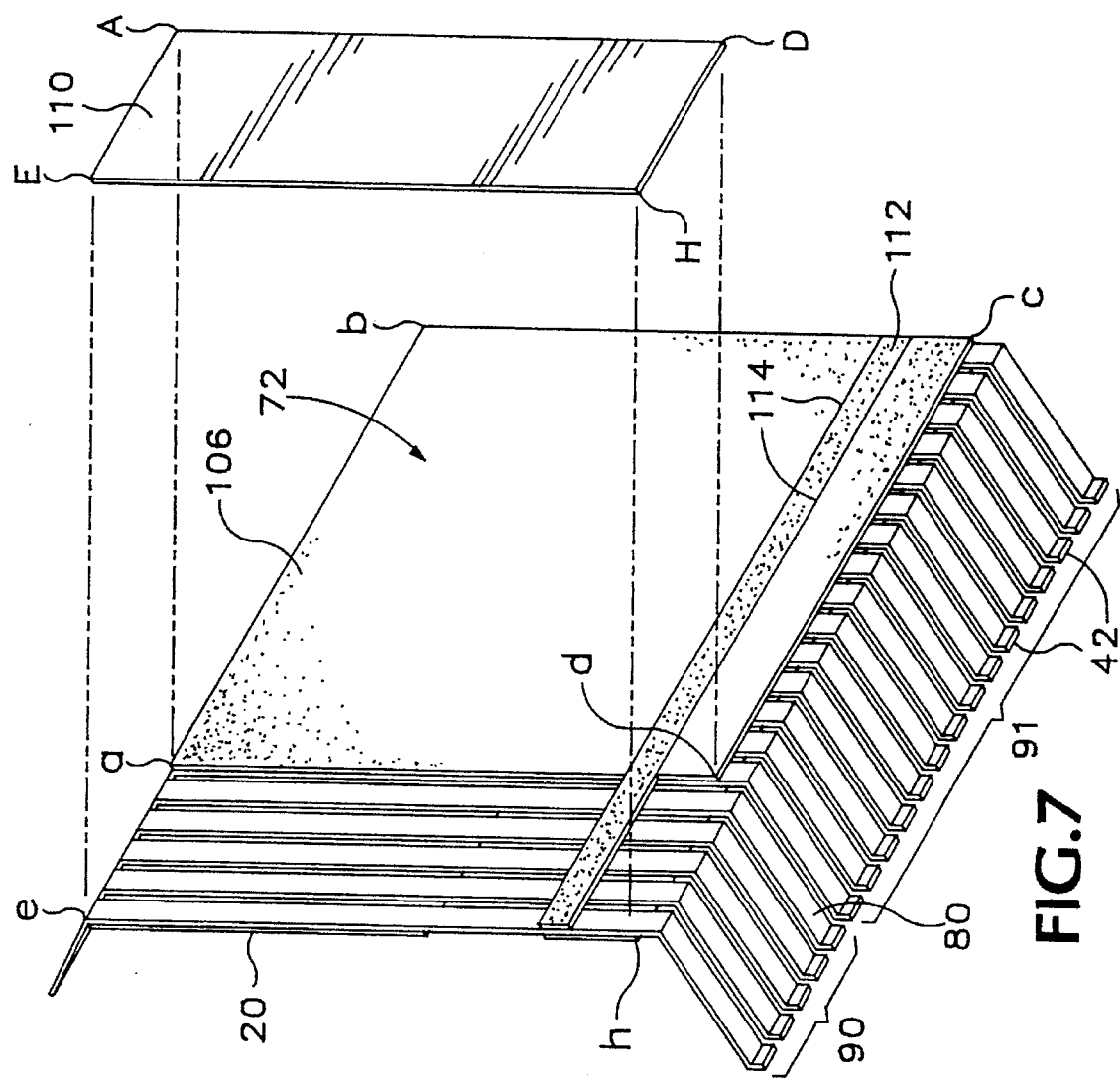
FIG. 7 is a partial perspective view as in FIG. 6 illustrating the installation of a narrow adhesive band across the lead frame after, or contemporaneous with, the positioning of an insulating layer over portions of the lead frame, and also illustrating the positioning of a conductive spacer over selected conductors on the lead frame.

Returning to FIG. 6, the next step in the method, after removing the outer-side adherent insulation from selected conductor 90, is to position a sheet of electrically insulating material over the portions of the outer side 72 of the lead frame which were not stripped of adherent insulation in the first step. An example of a suitable electrically insulating sheet material 106 for this purpose is adhesive-backed kapton, or another suitable electrically insulating tape. The insulating sheet material 106 preferably has a thickness of approximately 1-mil to 8-mils. Insulating sheet material 106, alternatively referred to as insulating layer 106 or as first insulating layer 106, is shown as a rectangular piece of kapton, its four corners being identified in FIG. 6 as ABCD. Those corners are positioned generally over points abcd on the lead frame, so that insulating layer 106 substantially covers a substantial portion of the flat central area 49 of the unstripped conductors 91 on the lead frame. FIG. 7 illustrates the lead frame 20 with insulating layer 106 installed on the lead frame.

To secure spacer 110 to lead frame 20, and also to secure an overlying conductive shield (described below) to the outer side 72 of lead frame 20, a narrow band of attachment is installed on the lead frame extending laterally across conductors 42. The narrow band of attachment, shown at 112 in FIG. 7, is preferably a narrow strip of double-sided adhesive, electrically insulating tape which extends laterally across lead frame 20, generally perpendicular to the conductors 42. Adhesive strip 112 is preferably recessed into the insulating layer 106 so that the surface of strip 112 is flush with the surface of insulating layer 106. A receiving channel is cut into insulating layer 106 after the insulating layer is secured to the lead frame. The edges of the receiving channel are shown in FIGS. 6 and 7 at 114. The receiving channel is formed by cutting parallel lines into insulating layer 106, after which the narrow strip of layer 106 between the lines 114 is removed. Then a strip 112 of electrically insulating double-sided adhesive tape 112, such as double-sided kapton tape, is installed in the channel. As shown in FIG. 7, adhesive strip 112 is longer than the lateral width (i.e., distance cd) of insulating layer 106. This strip 112 extends laterally over selected conductors 90.

FIG. 7 also shows another step in the method, which is the positioning of a conductive spacer 110 over the selected conductors 90, which were stripped of adherent insulation on the outer side 72 of lead frame 20 in the first step of the method. Conductive spacer 110 is preferably a sheet of conductive metal foil or a similar electrically conductive material. A suitable material for spacer 110 is beryllium copper foil. Spacer 110 preferably has the same general thickness as insulating layer 106. If, for example, insulating layer 106 is 4-mils thick, spacer 110 should also be 4-mils thick. Spacer 110 is sized to fit over the central leg portions of selected conductors 90, the central leg portions being the parts of each conductor 90 in the central flat region 49 of the lead frame. The four corners EADH of spacer 110 are positioned in registration with points eadh on lead frame 20, as shown in FIG. 7. Spacer 110 is held in place overlying selected conductors 90 by adhesive strip 112. Spacer 110 is unattached to conductors 90 except by adhesive strip 112. The function of spacer 110 is to make electrical contact with selected conductors 90, which is the reason the adherent insulation was removed from the outer side of conductors 90 in the first step of the method.

Figure 8:
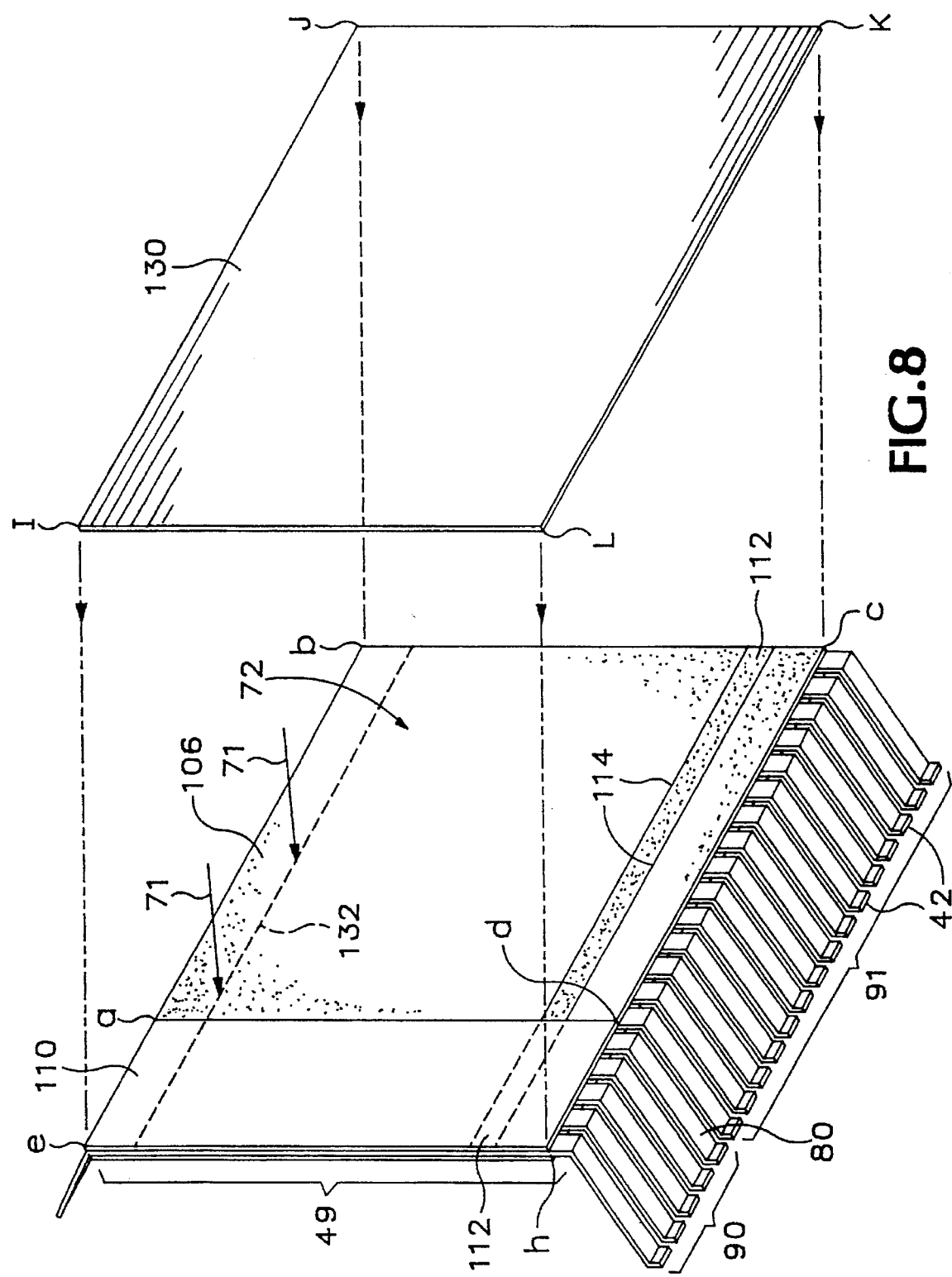
FIG. 8 is a partial perspective view as in FIGS. 6 and 7 in which a conductive shield is being positioned over portions of the outer side of the lead frame.

Referring to FIG. 8, adhesive strip 112 extends beneath spacer 110 when the spacer is positioned on the lead frame and is recessed into insulating layer 106. Strip 112 is preferably the same thickness as insulating layer 106 so that the upper surface of strip 112 is approximately flush with the upper surface of insulating layer 106 (the upper surface of strip 112 and layer 106 being the surface visible in FIG. 8).

FIG. 8 shows the lead frame 20 with insulating layer 106 and spacer 110 in position on the lead frame. Lead frame 20 is then further modified by the step of positioning a conductive shield 130 over the outer side 72 of the lead frame. Shield 130, also referred to as first shield 130, is an expanse of conductive sheet material such as gold coated beryllium copper foil. Shield 130 is sized to fit over substantially the entire central region 49 of the lead frame, extending over insulating layer 106 and spacer 110. In FIG. 8, the four corners of shield 130, IJKL, are positioned in registration with corners ebch on the lead frame when the shield is installed. The exposed portion of double-sided adhesive strip 112, the part not covered by spacer 110, holds shield 130 in place on lead frame 20. Shield 130 is unattached to lead frame 20 except along part of adhesive strip 112. When the lead frame is mounted on a holder 10 (see FIGS. 1 and 2), the clamping force exerted by the clamp assemblies 26, 28 prevent separation of shield 130 from adhesive strip 112. The adhesive strip serves principally to retain spacer 110 and shield 130 on the lead frame during handling and assembly of the lead frame, before it is mounted on a holder. Once the lead frame is clamped on to a holder, the entire lead frame assembly is secure. Shield 130 is unattached to lead frame 20 except along the narrow adhesive strip 112. This allows the lead frame to retain its flexibility. If the relatively stiff shield 130 was secured, by adhesive for example, to the entire area of insulating layer 106, the result would be a very rigid, unbendable assembly, due to the mutual reinforcement effect of metal conductors 42 and metal shield 130. To overcome this problem and retain the flexibility of lead frame 20, shield 130 is attached only along narrow adhesive strip 112. Since adhesive strip 112 is located in the general vicinity where the lead frame is clamped to a holder 10 the clamp assemblies 26, 28 provide a similar narrow strip of attachment which leaves most of the surface of shield 130 free of any secure attachment to the lead frame. The lead frame thus remains flexible enough to function normally when urged into contact with interconnect pins on a component being tested.

Once shield 130 is positioned on the outer side 72 of lead frame 20 it is brought into physical contact with conductive spacer 110. Since the spacer is likewise in physical contact with stripped conductors 90, the spacer forms an electrical interconnection between shield 130 and selected conductors 90. When lead frame 20 is installed on a holder 10 (see FIGS. 1 and 2) and a bending force is exerted against the upper part of the lead frame, along line 132 in the direction of arrow 71, conductive shield 130 is in electrical contact with a broad surface area of spacer 110. Similarly, the broad underside surface of spacer 110 is in electrical contact with conductors 90 over a substantial portion of their length. Thus, conductors 90 are electrically interconnected to shield 130 via spacer 110. Henceforward, conductors 90 on lead frame 20 will be referred to as shield-coupled conductors 90.

When shield 130 is positioned on lead frame 20, the portion of the shield overlying insulating layer 106 is electrically isolated from the underlying conductors on the lead frame. Those conductors which underlie insulating layer 106 are indicated by reference number 91 in FIG. 8. Because conductors 91 are electrically isolated from shield 130 in the modified lead frame of the present invention, henceforward conductors 91 will be referred to as shield-isolated conductors 91.

The electrical interconnection between shield 130 and shield-coupled conductors 90 is the principal reason that lead frame 20 exhibits improved performance during high frequency component tests. During high frequency tests, the current signal is carried by power/ground conductor 80 on lead frame 20 is subjected to high current gradients which can cause undesirable voltage fluctuations across power/ground conductor 80 due to inherent inductance. The above-described modifications to lead frame 20 reduce the inductance of power/ground conductor 80 because the entire surface of shield 130 is electrically part of conductor 80. As such, conductor 80 has a greatly expanded volume, or effective cross section, giving it a substantially lower inductance.

Turning to the inner side 70 of lead frame 20, FIG. 9 shows the lead frame 20, substantially as shown in FIG. 3, together with overlying layers to be applied in the following steps. The inner side 70 of lead frame 20 is modified first by positioning a sheet of insulating material 140, such as adhesive-backed 4-mil kapton, over the central region 49 of the lead frame conductors. Insulating layer 140, also referred to herein as the second insulating layer 140, is installed over all conductors on the lead frame, including the shield-coupled conductors 90, and the shield-isolated conductors 91, excepting only the contact region 62 on the shield-coupled conductors 90. The four corners of MNOP are positioned in registration with the corners mnop on the inner side 70 of lead frame 20. As viewed in FIG. 9, the shield-coupled conductors 90 are the first five conductors at the fight-hand edge of lead frame 20. A notch 144 or opening is formed in insulating layer 140 in order to leave uncovered the contact region 62 of the shield-coupled conductors. Notch 144 permits connections to be made to power/ground conductor 80 when the lead frame is mounted on a holder.

Figure 10:
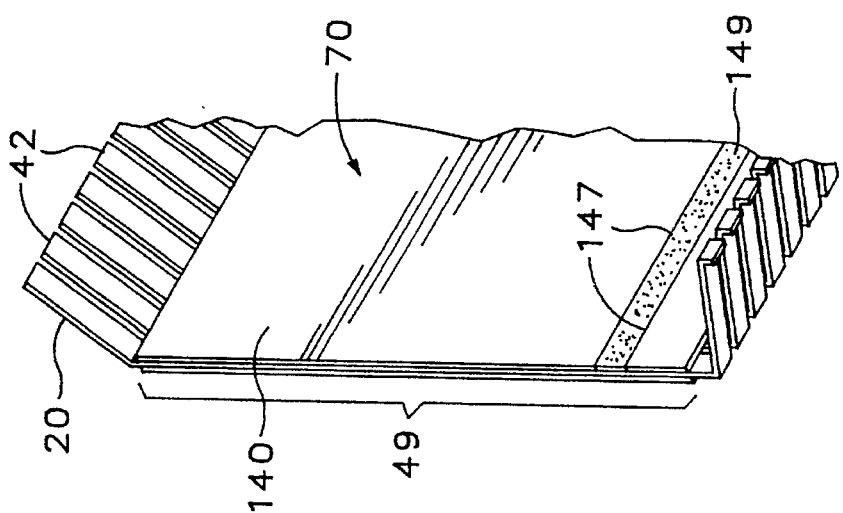
FIG. 10 is a partial perspective view of one edge of the lead frame of FIG. 9 following the positioning of the insulating layer on the inner side of the lead frame, illustrating the position of the double-sided adhesive strip on the inner side of the lead frame.

Once insulating layer 140 has been installed on lead frame 20, a narrow band of attachment, similar to strip 112 on outer side 72, is provided extending laterally across the lead frame. A narrow double-backed adhesive strip 149 (i.e., having adhesive on both sides) is positioned on insulating layer 140 in the general region where the lead frame 20 is clamped onto a holder 10. The band of attachment is provided by making two parallel linear cuts 147 in insulating layer 140 after the insulating layer has been positioned over, and adhesively bonded to, the inner side of lead frame 20. Parallel cuts 147 extend laterally across the insulating layer generally perpendicular to the longitudinal direction of conductors 42. Once cuts 147 are made in the insulating layer, the narrow strip 148 of insulating layer 140, between cuts 147, is removed and replaced by double-sided adhesive strip 149. The double-sided adhesive strip has approximately the same width as the narrow band 148 of insulating layer 140 which was removed from between cuts 147. FIG. 10 is a partial view of the inner side 70 of lead frame 20 after insulating layer 140 has been installed over the central region 49 of the lead frame conductors and after double-sided adhesive strip 149 is in place. Double-sided adhesive strip 149 is approximately the same thickness as insulating layer 140. Preferably, in the illustrated embodiment of the present invention, inner insulating layer 140, alternatively referred to as second insulating layer 140, has a thickness of between 1-mil and 8-mils and double-sided adhesive strip 149 similarly has a preferred thickness of between 1-mil and 8-mils. Once installed, adhesive strip 149 forms a narrow band of adhesion extending laterally across the lead frame generally perpendicular to the conductors 42 on lead frame 20.

The final layer applied to the inner side 70 of lead frame 20 is the inner conductive shield 150, alternatively referred to as second shield 150, which is preferably made of the same material as shield 130 in FIG. 8. Shield 150 is sized to have perimeter dimensions which correspond to, or are slightly smaller than those of insulating layer 140. It is important that second shield 150 does not overlap insulating layer 140 since one important function of insulating layer 140 is to electrically isolate shield 150 from all conductors on lead frame 20. A notch 154 forms an opening extending through second shield 150 in the same location as notch 144 in insulating layer 140. The dimensions of notch 154 should be equal to or slightly greater than the dimensions of notch 144, to ensure that no part of shield 150 overlaps or extends beyond any edge of insulating layer 140 in the region of notches 144, 154. The notches in shield 150 and insulating layer 140, on the inner side of 70 of lead frame 20, permit electrical interconnections to be made between a lead frame holder and the power/ground conductor 80 on lead frame 20.

Figure 14:
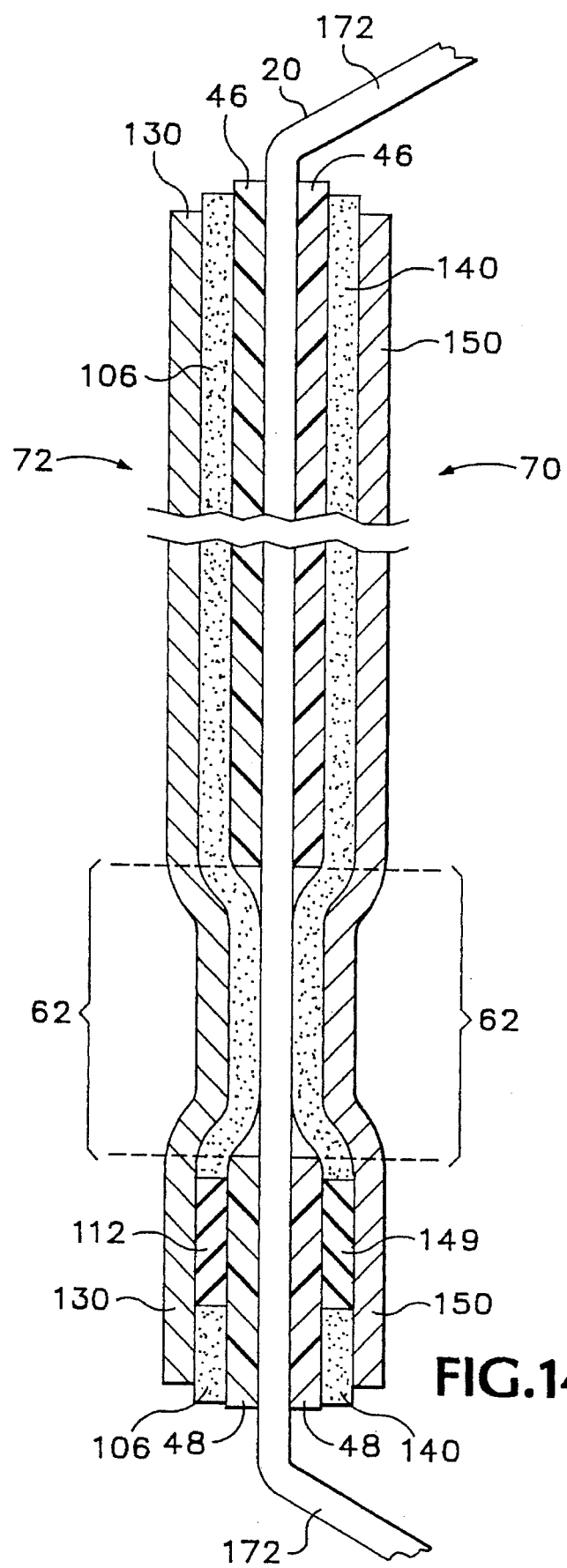
FIG. 14 is a view as in FIG. 13, taken along line 14—14 of FIGS. 11 and 12.

The fully assembled modified lead frame of the present invention is shown in FIGS. 11–14. FIG. 11 is a plan view of the outer side 72 of lead frame 20, partially cut away, and FIG. 12 is the plan view of the inner side 70 of lead frame 20. FIGS. 13 and 14 are cross-sectional views taken, respectively, along lines 13—13 and lines 14—14 of FIGS. 11 and 12.

Referring to FIG. 11, the flat central region 49 of the outer side 72 of lead frame 20 is substantially covered by first shield 130. Immediately beneath shield 130, visible around the perimeter edges 151 of shield 130, is spacer 110, to the left of line 160, and insulating layer 106 to the right of line 160. The perimeter dimensions of shield 130 are preferably slightly smaller than the perimeter dimensions of underlying insulating layer 106 to the right of Line 160 so that no part of shield 130 touches any exposed portion of one of the shield-isolated conductors 91. That ensures that the shield is, in fact, electrically isolated from all of the shield-isolated conductors on outer side 72 of lead frame 20. Line 160 is the dividing line between the conductive spacer 110, which overlies shield-coupled conductors 90, and first insulating layer 106, which overlies the shield-isolated conductors 91. Dashed lines 162, 164 illustrate the approximate edges of adhesive strip 112 beneath shield 130 and spacer 110.

FIG. 12 is a plan view of the inner side 70 of modified lead frame 20. Inner conductive shield 150 overlies a major portion of the central region 49 of the lead frame. Intermediate insulating layer 140 extends between shield 150 and lead frame 20. The insulating layer 140 is visible extending beyond and around the peripheral at edges 161 of shield 150 The perimeter dimensions of shield 150 are slightly smaller than the perimeter dimensions of underlying insulating layer 140 so that no part of shield 150 touches any exposed conductor 42. The shield 150 is thus isolated from all conductors on the lead frame. A notch or opening in insulating layer 140 is shown at 144, and a corresponding notch or opening in shield 150 is shown at 154. Notches 144, 154 are in registration with one another and provide an opening through insulating layer 140 and shield 150, respectively, to expose the contact region 62 of selected conductors 90. The perimeter dimensions of notch 154 is preferably slightly larger than the perimeter dimensions of notch 144, to insure that the conductive shield does not touch any of the selected conductors 90. Openings 144, 154 provide a connection path to the inner side of contact region 62 on the shield-coupled conductors 90 (those being the conductors which are electrically coupled, via spacer 110, to outer shield 130 on the opposite side 72 of the lead frame). The notches or openings 144, 154 allow connections to be made a from holder 10 to power/ground conductor 80 using a connector block 63 as shown and described above with reference to FIGS. 1, 2 and 13.

FIGS. 13 and 14 illustrate the layers of modified lead frame 20 at two different cross-sectional locations. FIG. 13 shows lead frame 20 in cross section taken along line 13—13 which extends between power/ground conductor 80 and the adjacent shield-coupled conductor immediately to the left of power/ground conductor 80 in FIG. 11. The conductor which extends down the Center of FIG. 13 is power/ground conductor 80. The layers to the left of conductor 80 are on the outer side 72 of lead frame 20. The layers on the right side of FIG. 13 are the layers on inner side 70 of lead frame 20. FIG. 13 also includes cross-sectional views of selected parts of lead frame clamp 26 (see FIGS. 1 and 2) and a portion of the grounding block 14 of holder 10 (shown in phantom).

Turning first to the leftside of FIG. 13, the layer immediately adjacent power/ground conductor 80 ion the outer side of the lead frame is conductive spacer 110. In this region (i.e., the region of shield-coupled-conductors 90), adhesive strip 112 passes between spacer 110 and conductor 80. Overlying spacer 110 is outer conductive shield 130. The electrical interconnection between shield 130 and spacer 110 is illustrated schematically by circuit line 168 in FIG. 13. The interconnection between spacer 110 and conductor 80 is schematically illustrated by line 170. The depiction of the various layers in FIG. 13 is schematic, the thicknesses of the various elements and layers being exaggerated for clarity.

Turning to the inner side 70 of lead frame 20, on the right side of FIG. 13, adherent insulation layers 46, 48 are immediately adjacent conductor 80, respectively, above and below the uninsulated contact region 62. Overlying adherent insulation 46, 48 is second insulating layer 140, which overlies all conductors on the inner side of the lead frame. Because FIG. 13 shows the lead frame in cross-section in the vicinity of shield-coupled conductors 90, insulating layer 140 extends above and below contact region 62, separated by notch or opening 144, which overlies contact region 62. The upper edge of notch 144, as viewed in FIGS. 12 and 13, is identified in FIG. 13 as 144a, and the lower edge of notch 144 is identified as 144b. The lower edge 144b of notch 144 is formed by the upper edge of double-sided adhesive strip 149. Overlying insulating layer 140 is conductive shield 150, which also has notch 154 positioned over contact region 62 on conductor 80, the upper edge of the notch being 154a and the lower edge being 154b. FIG. 13 also shows in cross section selected parts of clamp 26, clamp pieces 31, 32 (see also FIG. 1 and 2). Clamp pieces 31, 32 are compressed toward one another by threaded fasteners (not shown) which squeeze the inner and outer shields 150, 130, respectively, together to retain the lead frame on holder 10.

As noted above with reference to FIG. 2, lead frames mounted on a holder must remain flexible enough to allow the conductors to be flexed into contact with pads or pins on a component device being tested. Such flexibility is greatest in the upper part of lead frame 20. Dashed lines 110a, 130a and 150a schematically depict (in an exaggerated manner) the flexing of layers 110, 130, and 150, respectively, when the upper part of conductor 80 is bent or flexed toward or away from lead frame holder 10. The layers on modified lead frame 20, and the method of attachment of the layers overlying lead frame 20, permit the necessary flexing of the lead frame for it to function in a normal manner. On the outer side 72 of lead frame 20, conductive spacer 110 is attached to lead frame 20 only by double-sided adhesive strip 112 and clamp 26. Adhesive is not applied between the lead frame conductors and spacer 110 in other regions because to do so would inhibit the longitudinal slippage between spacer 110 and conductors 90 (see FIG. 11) necessary to allow the upper part of the lead frame to remain flexible. Similarly, outer shield 130 is secured to the lead frame only by double-sided adhesive strip 112 (in the region of shield isolated conductors 91, as shown in FIG. 14) and by clamp 26. No adhesive or other attachments are provided between outer shield 130 and the rests of the lead frame, except along strip 112 and clamp 26. As such, outer shield 130 is free to slide longitudinally against insulating layer 106 (see FIG. 14) when the upper part of the lead frame is flexed into contact with interconnect pins on a component being tested. On the inner side of the lead frame, inner shield 150 is similarly attached to lead frame 20 only by double-sided adhesive strip 149 and clamp 26 to allow mutual slippage between the shield and the lead frame.

FIG. 13 also illustrates the use of connector block 63 to make electrical contact with power/ground conductor 80 a lead frame 20. Referring also to FIG. 1, contactor block 63 is fitted into opening 64 in clamp piece 31, between raised ridges 65 which retain and position the contact block within opening 64. Contact block 63 extends through openings 144, 154 in insulating layer 140 and inner shield 150, respectively, to make contact with power/ground conductor 80 in the lead frame's contact region 62. A representative internal holder pin 18 is also shown in FIG. 13. Pin 18 extends through the central block 14 of holder 10, as described above with reference to FIGS. 1 and 2. Contact block 63 is either a solid block of conductive material, if it is being used to make contact with a ground conductor on the lead frame, or block 63 incorporates an internal capacitor (not shown) if the contactor block is making connection with a power conductor on the lead frame.

FIG. 14 shows the cross-sectional structure of modified lead frame 20 in the region of the shield-isolated conductors 91. A representative shield-isolated conductor 172 extends down the center of FIG. 14. The parts of clamp 26 shown in FIG. 13 are omitted in FIG. 14. As in FIG. 13, the drawing in FIG. 14 is somewhat schematic, with the thicknesses of the various elements layers exaggerated for clarity. The layers on the outer side 72 of lead frame 20 are shown on the left side of FIG. 14. The layer immediately adjacent conductor 172 are the upper and lower lands of adherent insulation 46, 48, respectively, separated by contact region 62. Overlying adherent insulation 46, 48 is outer insulating layer 106. Double-sided adhesive strip 112 forms part of layer 106 in the region just below contact region 62. Strip 112 has approximately the same thickness as insulating layer 106. Outer conductive shield 130 overlies insulating layer 106 and is the outermost layer. The shield is attached to insulating layer 106 only at the narrow band of attachment provided by adhesive strip 112. In other areas the conductive shield 130 is unattached to insulating layer 106. When lead frame 20 is mounted on a holder 10, clamp members 31, 32 would extend across the full width of lead frame 20, including the region illustrated in FIG. 14.

The inner side 70 of lead frame 20 is to the right of conductor 172 in FIG. 14. The layer immediately adjacent conductor 172 is the upper and lower lands of adherent insulation 46, 48, respectively, separated by contact region 62. Immediately overlying the adherent insulation is inner insulating layer 140. Double-sided adhesive strip 149 forms part of layer 140 in the region just below contact region 62. Adhesive strip 149 has approximately the same general thickness as insulating layer 140. Overlying insulating layer 140 is inner conductive shield 150, which is attached to insulating layer 140 only along the narrow band of attachment provided by adhesive strip 149. In other areas, the conductive shield 150 is unattached to insulating layer 140.

The modified lead frame of the present invention substantially reduces the inductance exhibited by the power/ground conductor on the lead frame during high frequency tests of electronic components. The reduction in inductance results from the substantial increase in the width or cross section of power/ground conductor 80 on the lead frame due to the electrical coupling of conductor 80 and outer shield 130 via spacer 110. In effect, the entire outer shield 130 becomes part of the conductive mass which carries the power or ground connection carried on conductor 80. A power or ground signal passing through conductor 80 is thus able to handle large current gradients without substantial voltage fluctuation. The inductance of power/ground conductor 80 on lead frame 20 is substantially reduced as a result of the shorting connection between all of the shield-coupled conductors 90 on the lead frame, as well as the electrical connection between conductor 80 and outer shield 130. The inner shield 150 is not electrically coupled to any of the conductors on the lead frame and serves primarily to help shield the lead frame from external electromagnetic noise. Inner conductive shield 150 is, in fact, grounded against holder grounding block 14 when the lead frame 20 is mounted on lead frame holder 10.

Alternative embodiments are possible within the scope of the present invention. For example, the modifications to a lead frame 20 can also be made to lead frames having differing configurations, such as lead frames made up of conductors which have contact fingers at only one end, instead of two, or lead frames with uniform conductors of different sizes or spacings from the size and spacing of the conductors on illustrated lead frame 20. For example, lead frames having fewer leads or wider leads, or a greater or lesser number of leads, are readily available. All can be modified to reduce the inductance of the power/ground conductor by employing the methodology of the present invention. The use of a conductive spacer 110 to electrically couple the power/ground conductor and outer shield 130 is optional. A narrower spacer which is only wide enough to contact a substantial portion of the length of the power/ground conductor 80 would make the necessary electrical connection between conductor 80 and outer shield 130. The most important connection is between power/ground conductor 80 and outer shield 130. It is not absolutely necessary that a connection be made between power/ground conductor 80 and the "extra" conductors 82 (see FIG. 5) be made. Use of a wider spacer is recommended, if the power/ground conductor is not adjacent the edge of the lead frame because the spacing between shield 130 and the lead frame is more uniform if a spacer is used to fill the space between the shield and lead frame. The length or depth of notches 144, 154 on the inner side of the modified lead frame will vary depending on the location of power/ground conductor 80. For example, if the power/ground conductor 80 is immediately adjacent the edge of the lead frame, notches 144, 154 would be much shorter in length since only the first conductor on the lead frame would have to make connection to a connector block on a holder 10. Alternatively, if the power/ground conductor 80 is a greater distance from the edge of the lead frame, notches 144, 154 need to be correspondingly deeper or longer to expose the contact region on the inner side of the power/ground conductor.

The modifications to the inner side of lead frame 20 shown in FIGS. 8–10 can be accomplished before or after the modifications shown and described above with reference to FIGS. 5–7. Other changes and modifications to the lead frame and method of the present invention will occur to those skilled in the art.

The overall thickness specified for insulating layers 106, 140 may vary within the scope of the present invention. A typical range for the thickness of kapton insulating material is 1-mil to 8-mils, although insulation of other thicknesses may be used. Similarly, the specified thickness of double-sided adhesive strips 112, 149 will vary with the thickness of the insulating layers. The adhesive strips should be approximately the same thickness as the insulating layers into which the adhesive strips are inserted. The preferred and recommended thickness for insulating layers 106, 140 is 4-mils or greater, in part because thinner insulating layers may cause undesirable capacitive coupling between the outer and inner conductive shields 130, 150, respectively. Shields 130, 150 can be made of materials having thicknesses different from those specified, although the shields must be of sufficient thickness to be self-supporting so they do not easily fold, crumple or wrinkle. It is generally recommended that conductive foil having a thickness of at least 4-mils be used for shields 130, 150. Other changes and modifications will occur to those skilled in the art.

The method of the present invention includes a relatively labor-intensive process for providing adhesive bands 112, 149 on the outer and inner sides of the lead frame, respectively. The method, which requires cutting parallel lines longitudinally across the lead frame, removing a narrow section of the insulating layer, and substituting double-sided adhesive strips in place of their removed insulating material, could readily be simplified for mass quantity production of modified lead frames. One alternative method for providing a narrow adhesive surface extending laterally across the lead frame would be to employ a customized strip material, or tape, made of electrically insulating material. One side of the tape would be covered with adhesive and would be oriented toward the lead frame when installing the tape on the lead frame in place of insulating layers 106, 140. The other side of the tape would have a pre-applied narrow band of adhesive at the location of adhesive bands 112, 149 in FIGS. 11 and 12, respectively. Use of such a customized insulating tape would eliminate the laborious process of cutting and removing a narrow lateral band from insulating layers 106, 140. It would still be necessary to install some type of limited-surface adhesive between spacer 110 and conductors 90 to retain the spacer on the lead frame. Yet another alternative means for providing narrow strips of adhesive extending laterally across lead frame 20 on insulating layers 106, 140 would be to coat a narrow band at the desired location with a suitable liquid adhesive or the like following installation of the insulating layers.

Each of the above-described techniques will provide for the narrow band of adhesive material shown at 112 and 149 in FIGS. 7 and 10 respectively.

What is claimed is:

1. A low noise multi-lead contact adapted from a lead frame of the type which is mounted on a lead frame holder used in electrical component test handlers, such a lead frame including a plurality of parallel conductors for selectively completing multiple simultaneous electrical connections with interconnect points on components being tested, the lead frame having opposed inner and outer sides and being mounted on a holder in a predetermined orientation with the inner side facing the major mass of the holder, the low noise multi-lead contact comprising:

on the outer side of the lead frame, a first shield formed of an expanse of conductive material overlying a portion of the lead frame, said first shield being electrically coupled to one or more selected conductors on the lead frame, whereby such shield-coupled conductors have reduced inductance during selected component tests, the other conductors on the lead frame being shield-isolated conductors which are electrically isolated from said first shield; and on the inner side of the lead frame, a second shield formed of an expanse of conductive material overlying a portion of the lead frame, said second shield being electrically isolated from all conductors on the lead frame.

2. A low noise multi-lead contact as in claim 1 in which said first and second shields are each affixed respectively to said inner and outer sides of the lead frame by a band of attachment extending laterally across said lead frame generally perpendicular to said parallel conductors, said shields being unattached except along said band of attachment, whereby said lead frame is flexible and resilient to make selective electrical connections with component interconnect points during said tests.

3. A low noise multi-lead contact as in claim 1 in which said first shield overlies both the shield-coupled and shield-isolated conductors on the lead frame, including a first insulating layer formed of electrically insulating sheet material extending between said first shield and the shield-isolated conductors on the lead frame, and including a second insulating layer formed of electrically insulating sheet material extending between said second shield and all conductors on the lead frame.

4. A low noise multi-lead contact as in claim 1 in which said first and second insulating layers each have a thickness generally in the range of 1-mil to 8-mils.

5. A low noise multi-lead contact as in claim 4 in which said first and second insulating layers are attached to the lead frame by adhesive.

6. A low noise multi-lead contact as in claim 1 in which said first shield on the outer side of the lead frame overlies both the shield-coupled and shield-isolated conductors on the lead frame, including a first insulating layer extending between said first shield and the shield-isolated conductors and a conductive spacer extending between said first shield and the shield-coupled conductors on the lead frame, and in which, on the inner side of the lead frame, said second shield overlies portions of all conductors on the lead frame, and including a second insulating layer extending between said second shield and the conductors on the lead frame.

7. A low noise multi-lead contact as in claim 6 in which said first shield is affixed to said first insulating layer on the outer side of the lead frame by a band of attachment extending laterally across said lead frame generally perpendicular to said parallel conductors, and said second shield is affixed to the inner side of the lead frame by a band of attachment extending laterally across said lead frame generally perpendicular to said parallel conductors, said shields being unattached to the lead frame except along said bands of attachment, whereby said lead frame is flexible and resilient to make selective electrical connections with component interconnect points during tests.

8. A low noise multi-lead contact as in claim 6 in which said first insulating layer and said spacer each have a thickness generally in the range of 1-mil to 8-mils.

9. A low noise multi-lead contact as in claim 1 in which each conductor on the lead frame includes a substantially straight central arm terminating at at least one of the ends with a contact finger extending from the central arm at an angle therefrom, said first and second shields overlying a major portion of the central arms of the conductors on the lead frame, whereby said shields reduce the electromagnetic noise conveyed to components during testing.

10. A low noise multi-lead contact for mounting on holders used in electrical component test handlers designed to selectively complete multiple simultaneous electrical connections with interconnect points on components being tested, the low noise multi-lead contact comprising:

a lead frame including multiple parallel conductors, each conductor including an elongated central arm terminating at at least one of the ends with an uninsulated finger for completing external electrical connections, including an uninsulated contact region along a portion said arm for making electrical contact with cooperating contact pins on holders, and including adherent insulation covering other selected surface areas of said arm, said adherent insulation extending laterally between adjacent conductors to secure the conductors to one another;

first and second shields each formed of an expanse of conductive material positioned over respective first and second opposed sides of said lead frame, said shields extending over a major portion of the central arms of said conductors;

first and second insulating layers extending between said lead frame and said respective first and second shields, whereby said shields are spaced from said lead frame;

an electrical interconnection extending through said first insulating layer between said first shield and one or more selected conductors on said lead frame, whereby such shield-coupled conductors have reduced inductance during selected component tests, the other conductors on the lead frame being shield-isolated conductors which are electrically isolated from said first shield by said first insulating layer; and a connection path on said second side of said lead frame, through which selected electrical connections can be made with cooperating contact pins on one of said holders, said connection path extending from said shield-coupled conductors through said second insulating layer.

11. A low noise multi-lead contact as in claim 10 in which said first and second shields are each affixed respectively to said first side and said second side of said lead frame by a narrow band of adhesive material extending laterally across said lead frame generally perpendicular to said parallel conductors, said shields being unattached to said lead frame except along said narrow band of adhesive material, whereby said lead frame, with said shields attached thereto, is flexible and resilient.

12. A low noise multi-lead contact as in claim 10 in which said electrical interconnection extending through said first insulating layer includes a conductive spacer extending between said first shield and a first side of said shield-coupled conductors, and wherein portions of the adherent insulation on said first side of said shield-coupled conductors is removed to permit said spacer to contact said first shield and said shield-coupled conductors, thereby providing a conductive path via said spacer between said first shield and said shield-coupled conductors.

13. A low noise multi-lead contact as in claim 10 in which said central arm portion of each said conductor in said lead frame is substantially straight, and each said finger at at least one of the ends of said central arm extends therefrom at an obtuse angle, and said first and second shields extend over major portions of said first and second sides of said central arms on the conductors, whereby said shields reduce the electromagnetic noise conveyed to components during testing.

14. A low noise multi-lead contact as in claim 10 in which at least one of said selected conductors on said lead frame is a conductor which supplies power to one of said components being tested.

15. A low noise multi-lead contact as in claim 10 in which said lead frame is mounted on one of said holders with said second side facing one of the holders.

16. A method of modifying a lead frame of the type which is mounted on a holder used in component test handlers designed to selectively complete multiple simultaneous electrical connections with interconnect points on components being tested, such lead frames having multiple parallel conductors partially covered by adherent insulating material which extends laterally between adjacent conductors to secure the conductors to one another, the lead frames having outer and inner sides for mounting in a predetermined orientation on the holder, the outer side facing away from, and the inner side facing toward, the major mass of said holder when mounted thereon, the method of modifying the lead frame comprising:

a) on the outer side of the lead frame, remove an area of adherent insulation to expose the outer side of one or more selected conductors;

b) on the outer side of the lead frame, outside the area where the adherent insulation is removed in step a), position insulating sheet material over a major portion of the lead frame to provide a first insulating layer overlying the lead frame;

c) on the outer side of the lead frame, position a first shield, formed of an expanse of conductive material, over the first insulating layer provided in step b) and over portions of the selected conductors exposed in step a), and establish an electrical connection between said first shield and said selected conductors, whereby said selected conductors are electrically coupled to the first shield and the first shield is electrically isolated from the other conductors on the lead frame;

d) on the inner side of the lead frame, position insulating sheet material over a major portion of the lead frame to provide a second insulating layer overlying the lead frame, said second insulating layer including an opening there through adjacent said selected conductors, whereby selected electrical connections can be established through said opening between said holder and said selected conductors; and e) on the inner side of the lead frame, position a second shield, formed of an expanse of conductive material, over said second insulating layer, except over said opening, such that said second shield is electrically isolated from all conductors on the lead frame by said second insulating layer.

17. A method of modifying a lead frame as in claim 16 including the additional step, on the outer side of the lead frame, of securing said first shield to the lead frame by means of a narrow band of adhesive material extending laterally across the lead frame, generally perpendicular to parallel conductive strips, and including the additional step, on the inner side of the lead frame, of securing said second shield to the lead frame by means of a narrow band of adhesive material extending laterally across the lead frame, generally perpendicular to the parallel conductive strips, said securing steps leaving said first and second shields unattached to first and second sides of the lead frame except along said narrow band of adhesive material, whereby the flexibility of the lead frame remains substantially unchanged by the attachment of the shields.

18. A method of modifying a lead frame as in claim 16 wherein the portion of step c) in which an electrical connection is established between said first shield and said selected conductors further includes positioning a conductive spacer between the selected conductors exposed in step a) and the first shield, whereby said selected conductors are electrically coupled to the first shield via said conductive spacer.

* * * * *